(12) United States Patent
Fujioka

(10) Patent No.: US 10,938,193 B2
(45) Date of Patent: Mar. 2, 2021

(54) SHIELDED CONDUCTIVE PATH AND SHIELDING PIPE

(71) Applicant: SUMITOMO WIRING SYSTEMS, LTD., Yokkaichi (JP)

(72) Inventor: Ryo Fujioka, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 16/958,232

(22) PCT Filed: Dec. 6, 2018

(86) PCT No.: PCT/JP2018/044821
§ 371 (c)(1),
(2) Date: Jun. 26, 2020

(87) PCT Pub. No.: WO2019/131032
PCT Pub. Date: Jul. 4, 2019

(65) Prior Publication Data
US 2020/0343702 A1 Oct. 29, 2020

(30) Foreign Application Priority Data
Dec. 27, 2017 (JP) .............................. JP2017-250913

(51) Int. Cl.
*H01B 7/20* (2006.01)
*H02G 3/04* (2006.01)
*B60R 16/02* (2006.01)

(52) U.S. Cl.
CPC ............. *H02G 3/0481* (2013.01); *H01B 7/20* (2013.01); *B60R 16/0215* (2013.01); *H01B 7/205* (2013.01); *H01B 7/207* (2013.01)

(58) Field of Classification Search
CPC .. H05K 9/0098; B60R 16/02; B60R 16/0215; H01B 7/20; H01B 7/205; H01B 7/207; H02G 3/0406; H02G 3/0481
(Continued)

(56) References Cited

U.S. PATENT DOCUMENTS 5,511,609 A * 4/1996 Tyler ..................... F22B 37/107
122/DIG. 13
9,504,193 B2 * 11/2016 Sugino ................. H05K 9/0049
(Continued)

FOREIGN PATENT DOCUMENTS

| JP | 2010-200549 A | 9/2010 |
| JP | 2015-165468 A | 9/2015 |

OTHER PUBLICATIONS

Feb. 19, 2019 International Search Report issued in International Patent Application No. PCT/JP2018/044821.

*Primary Examiner* — Timothy J Thompson
*Assistant Examiner* — Michael F McAllister
(74) *Attorney, Agent, or Firm* — Oliff PLC

(57) ABSTRACT

A shielded conductive path, including: a cylindrical shielding pipe that is in a state in which two semi-cylindrical members made of a metal material are joined together, and that is provided with a bend at a portion located in an axial direction; an electrical wire housed in the shielding pipe; a first weld that is provided only in a partial region of the shielding pipe that includes at least the bend in the axial direction, the first weld liquid-tightly joining the two semi-cylindrical members; and a second weld that is provided in all regions of the shielding pipe other than the first weld in the axial direction, the second weld liquid-tightly joining the two semi-cylindrical members, wherein a joining range of the second weld in a radial direction is narrower than a joining range of the first weld in the radial direction.

6 Claims, 8 Drawing Sheets

(58) Field of Classification Search
USPC .................................................. 174/68.3, 36
See application file for complete search history.

(56) References Cited

U.S. PATENT DOCUMENTS

| | | | |
|---|---|---|---|
| 10,147,514 B2* | 12/2018 | Sugino | H01B 7/0045 |
| 10,602,647 B2* | 3/2020 | Kimoto | H01R 13/6592 |
| 10,701,846 B1* | 6/2020 | Kimoto | H02G 3/0481 |
| 2004/0099427 A1 | 5/2004 | Kihira | |
| 2015/0250079 A1* | 9/2015 | Sugino | H05K 9/0098 |
| | | | 174/372 |

* cited by examiner

SHIELDED CONDUCTIVE PATH AND SHIELDING PIPE

BACKGROUND

The present disclosure relates to a shielded conductive path and a shielding pipe.

JP 2004-171952A discloses a conductive path that is provided with a shield function and is installed under the floor of a vehicle body. This shielded conductive path is provided with a shielding pipe made of metal, and a plurality of electrical wires inserted into the shielding pipe. Because the shielding pipe is installed between a position near an inverter apparatus provided in an engine room and a position near a battery disposed in a rear end portion of the vehicle body, the shielding pipe has an entire length of about 3 to 4 m. Thus, when an electrical wire is inserted into the shielding pipe, the electrical wire buckles and frictional resistance occurs between the electrical wire and an inner circumferential surface of the shielding pipe, resulting in poor workability.

SUMMARY

As a means for resolving the above-described workability issues, a method is conceivable in which the shielding pipe is in a state in which two semi-cylindrical members resulting from the shielding pipe being divided in a radial direction are joined together, an electrical wire is placed on one of the semi-cylindrical members, the other semicircular cylindrical member is placed thereon from an upper side and joined together, and the joined state thereof is achieved through welding. According to this method, before the members are joined, electrical wire housing spaces of the semi-cylindrical members are open over the entire length of the shielding pipe, and thus an insertion operation is not required. However, there is a problem in that the process for welding long semi-cylindrical members takes time, whereas there is an advantage in that an insertion operation is not required.

An exemplary aspect of the disclosure aims to reduce the time needed for manufacturing a shielded conductive path.

A shielded conductive path according to a first aspect includes: a cylindrical shielding pipe that is in a state in which two semi-cylindrical members made of a metal material are joined together, and that is provided with a bend at a portion located in an axial direction; an electrical wire housed in the shielding pipe; a first weld that is provided only in a partial region of the shielding pipe that includes at least the bend in the axial direction, the first weld liquid-tightly joining the two semi-cylindrical members; and a second weld that is provided in all regions of the shielding pipe other than the first weld in the axial direction, the second weld liquid-tightly joining the two semi-cylindrical members, in which a joining range of the second weld in a radial direction is narrower than a joining range of the first weld in the radial direction.

A shielding pipe according to a second aspect includes: two semi-cylindrical members made of a metal material; a cylindrical pipe main body that is in a state in which the two semi-cylindrical members are joined together, whose inner portion serves as an electrical wire housing space for housing an electrical wire, and that is provided with a bend at a portion located in an axial direction, a first weld that is provided only in a partial region of the pipe main body that includes at least the bend in the axial direction, the first weld liquid-tightly joining the two semi-cylindrical members; and a second weld that is provided in all regions of the pipe main body other than the first weld in the axial direction, the second weld liquid-tightly joining the two semi-cylindrical members, in which a joining range of the second weld in a radial direction is narrower than a joining range of the first weld in the radial direction.

According to the first and second aspects, because the two semi-cylindrical members are liquid-tightly joined by the first weld and the second weld over the entire length thereof, water is prevented from entering from a joined portion of the two semi-cylindrical members. Also, because the joining range of the second weld in the radial direction is narrower than that of the first weld, the time required for welding can be reduced. Thus, the shielded conductive path according to the first aspect can be manufactured in short time. Also, the shielding pipe according to the second aspect makes it possible to reduce the time needed for manufacturing a shielded conductive path configured with an electrical wire housed in the pipe main body.

DETAILED DESCRIPTION OF EMBODIMENTS

Figure 1:
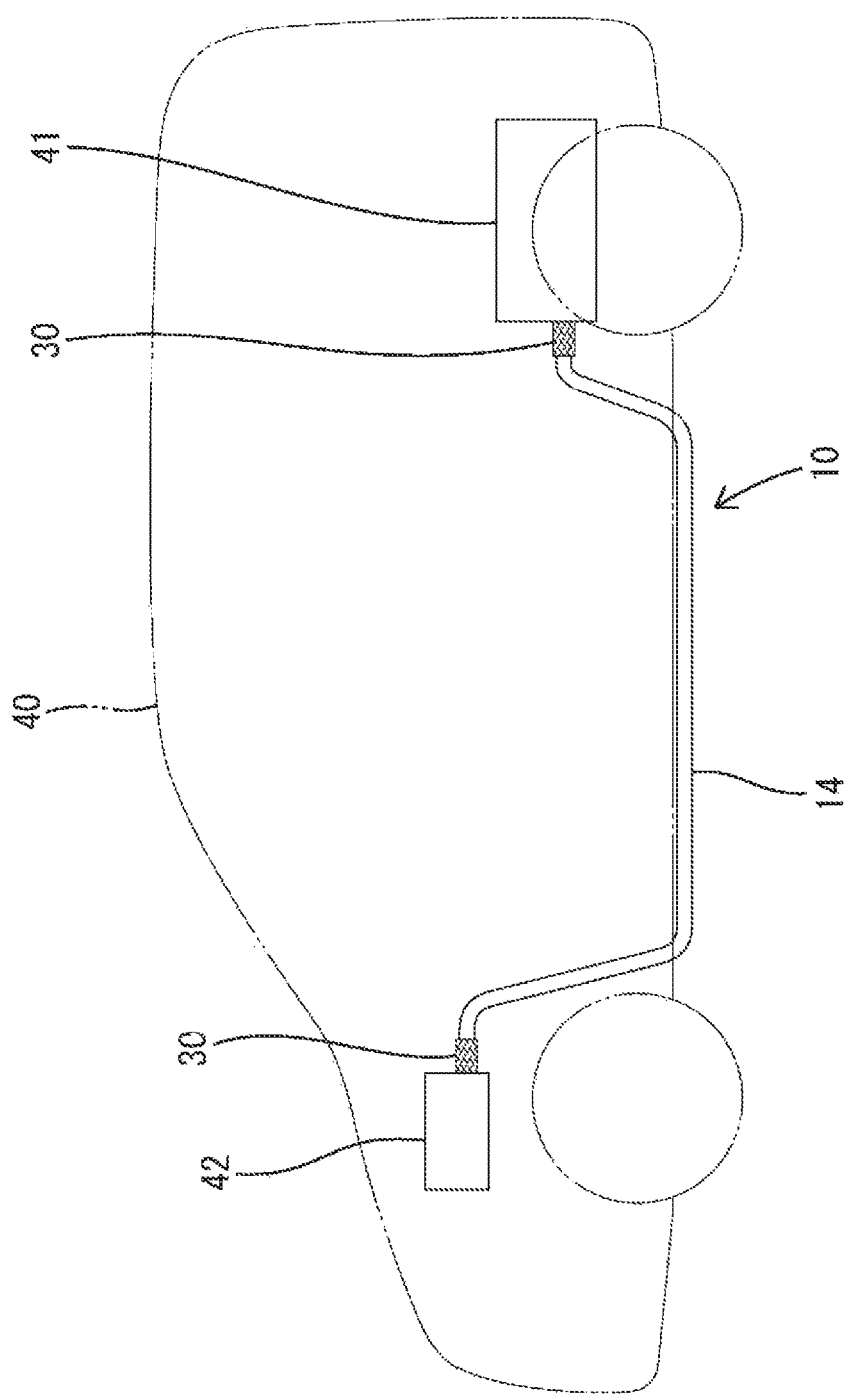
FIG. 1 is a schematic diagram showing the layout of a shielded conductive path of Embodiment 1.
Figure 2:
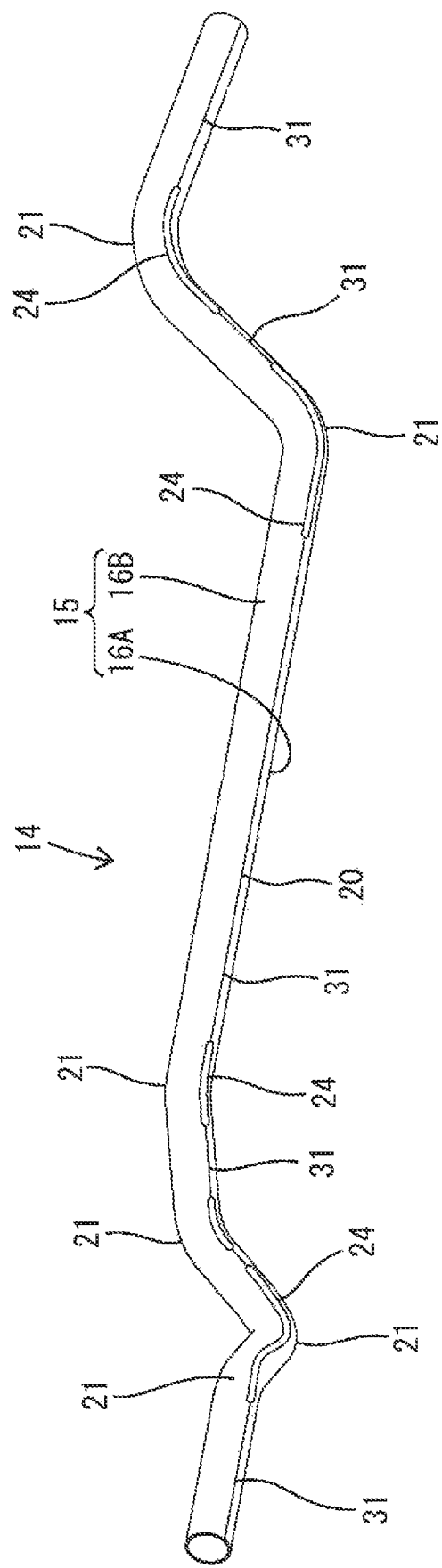
FIG. 2 is a perspective view of a shielding pipe.

In the first and second aspects, the joining range of the first welding portion in the radial direction may include outer circumferential surfaces of the semi-cylindrical members. With this configuration, in the first welding portion, no gap having a groove shape appears at the seam on outer peripheries of the two semi-cylindrical members, and thus it is possible to prevent water from remaining in the outer peripheries of the two semi-cylindrical members.

In the first and second aspects, the joining range of the first welding portion in the radial direction may be the entire region extending from outer peripheries of the semi-cylindrical members to inner peripheries thereof. With this configuration, it is possible to ensure the maximum bonding strength in the first welding portion.

In the first and second aspects, the joining range of the second welding portion in the radial direction may include outer circumferential surfaces of the semi-cylindrical members. With this configuration, in the second welding portion, no gap having a groove shape appears at the seam on outer peripheries of the two semi-cylindrical members, and thus it is possible to prevent water from remaining in the outer peripheries of the two semi-cylindrical members.

With the first aspect, a leading end side linear portion of the shielding pipe that is adjacent to a leading end side of the bending-processing portion in the axial direction may be joined by the first welding portion. Unlike this embodiment, if the leading end side linear portion is joined by the second welding portion, there is a concern that when a bending-processing portion is formed by sliding a bending jig against the outer periphery of a pre-processing linear region from the base end side to the leading end side in a pressed state, on the leading end side with respect to the bending-processing portion, the second welding portion will break, the two semi-cylindrical members will positionally shift relative to each other in the axial direction, and cracks will occur in the semi-cylindrical members. In view of this point, the leading end side linear portion is joined by the first welding portion in this embodiment. Accordingly, it is possible to prevent the two semi-cylindrical members from positionally shifting relative to each other in the axial direction and to prevent cracks from occurring in the semi-cylindrical members, on the leading end side with respect to the bending-processing portion.

With the first aspect, a base end side linear portion of the shielding pipe that is adjacent to a base end side of the bending-processing portion in the axial direction may be joined by the first welding portion. Unlike this embodiment, if the base end side linear portion is joined by the second welding portion, there is a concern that when a bending-processing portion is formed by sliding a bending jig against the outer periphery of the pre-processing linear region from the based end side to the leading end side in a pressed state, without fixing the base end side with respect to the pre-processing linear region of the shielding pipe that is to be the bending-processing portion, the second welding portion will break on the base end side with respect to the bending-processing portion, and the two semi-cylindrical members will separate from each other in the radial direction. In view of this point, the base end side linear portion is joined by the first welding portion in this embodiment. Accordingly, it is possible to prevent separation of the two semi-cylindrical members in the radial direction on the base end side with respect to the bending-processing portion.

With the first aspect, the first welding portion may include a bending portion welding region where the bending-processing portion is joined, a leading end side welding region where the leading end side linear portion is joined, and a base end side welding region where the base end side linear portion is joined, and the length of the leading end side welding region may be set larger than that of the base end side welding region. While the bending jig that is slid against the pre-processing linear region to be a bending-processing portion in a pressed state moves from a base end of the pre-processing linear region to a leading end thereof, a force that makes the two semi-cylindrical members displace relative to each other in the axial direction, and a force that forms cracks in the semi-cylindrical members are constantly applied to the leading end side welding region. Thus, providing the leading end side welding region long in the axial direction makes it possible to effectively prevent cracking and relative displacement of the semi-cylindrical members in the axial direction.

Also, in a process for forming a bending-processing portion by sliding the bending jig against the pre-processing linear region in a pressed state, a force applied from the bending jig to the base end side welding region decreases as the bending jig moves away from a base end of the pre-processing linear region (the base end side welding region). Thus, even if the length of the base end side welding region in the axial direction is reduced, it is possible to effectively prevent separation of the two semi-cylindrical members in the radial direction. The above-described configuration makes it possible to keep the length of the base end side welding region to the shortest necessary length, and thus to more effectively reduce the time needed for manufacturing a shielded conductive path.

Embodiment 1

The following describes Embodiment 1 embodying the present disclosure with reference to FIGS. 1 to 11. Note that in the following description, with regard to the front-rear direction, the left side in FIGS. 1, 2, and 4 to 11 is defined as a front side. With regard to the up-down direction, the orientation shown in FIGS. 5, and 7 to 11 is directly defined as up and down.

Shielded Conductive Path 10

As shown in FIG. 1, a shielded conductive path 10 of Embodiment 1 is installed in a vehicle provided with a motor (not shown) as a driving source, such as a hybrid car. The shielded conductive path 10 conductively connects a device 41 such as a high-voltage battery 40 provided in a rear portion of a body 40, and a device 42 such as an inverter or a fuse block provided in a front portion of the body 40, for example. The shielded conductive path 10 includes a plurality (two in the case of Embodiment 1) of electrical wires 11, one shielding pipe 14, and two flexible shielding members 30.

Figure 3:
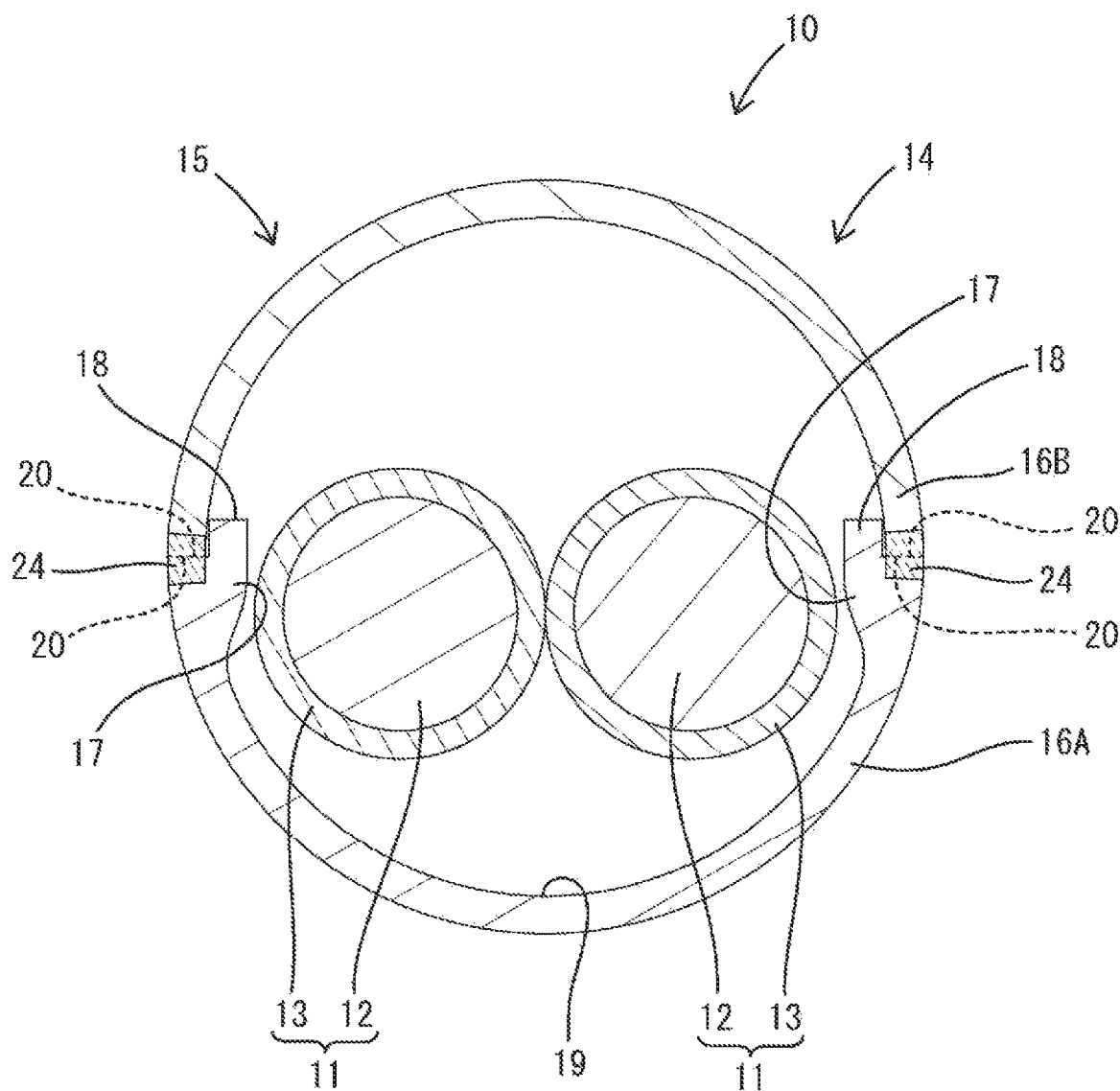
FIG. 3 is a cross-sectional view of the shielded conductive path.

As shown in FIG. 3, the electrical wires 11 are each an electrical wire of a non-shielded type obtained as a result of a conductor 12 being enclosed by an insulating coating 13 made of a synthetic resin. The conductor 12 is constituted by a twisted wire obtained by twisting together thin metal wires made of copper, aluminum, or the like, and thus the electrical wires 11 have flexibility. Terminal fittings (not shown) are connected to front and rear end portions of each electrical wire 11. The terminal fitting connected to the front end portion of the electrical wire 11 is connected to the device 42 via a connector (not shown). The terminal fitting connected to the rear end portion of the electrical wire 11 is connected to the device 41 via a connector (not shown).

The shielding pipe 14 is made of a metal material (iron, aluminum, copper, stainless steel, or the like), and has a shielding function. The shielding pipe 14 is long (e.g., about 3 to 4 m), and has a shape holding property of maintaining a predetermined shape due to the rigidity of the shielding pipe 14. Accordingly, the shielding pipe 14 is installed under the floor of the body 40. The cross-sectional shape of the shielding pipe 14 is substantially circular over the entire length thereof.

Portions of a plurality of electrical wires 11 that are led out from the front end of the shielding pipe 14 in the length direction to the outside are collectively enclosed by the shielding member 30. Portions of the plurality of electrical wires 11 that are led out from the rear end of the shielding pipe 14 in the length direction to the outside are also collectively enclosed by the shielding member 30. The shielding member 30 is formed by a braided wire formed by weaving conductive thin metal wires (copper or the like) into a mesh and forming the woven metal wire into a tubular shape, a metal foil formed into a tubular shape, or the like, and similarly to the electrical wires 11, the shielding member 30 has flexibility.

The rear end portion of the front shielding member 30 is conductively fixed to the front end portion of the shielding pipe 14 through crimping or the like. The front end portion of the front shielding member 30 is conductively connected to a shield shell (not shown) of the front device 42. The front end portion of the rear shielding member 30 is conductively fixed to the rear end portion of the shielding pipe 14 through crimping or the like. The rear end portion of the rear shielding member 30 is conductively connected to a shield shell (not shown) of the rear device 41.

Shielding Pipe 14

Next, the shielding pipe 14 will be described in detail. The shielding pipe 14 is provided with a pipe main body 15, a plurality of first welding portions 24 (first welds), and a plurality of second welding portions 31 (second welds). The pipe main body 15 is in a state in which a linear first semi-cylindrical member 16A (a semi-cylindrical member) and a linear second semi-cylindrical member 16B (a semi-cylindrical member) that are formed through extrusion are joined together in the radial direction thereof. The first semi-cylindrical member 16A is provided with overhanging portions 17 whose both edge portions in the circumferential direction radially protrude toward an inner side, and ribs 18 that protrude from the overhanging portions 17 in the circumferential direction and are continuous over the entire length of the first semi-cylindrical member 16A.

When the plurality of electrical wires 11 are housed in the shielding pipe 14 (the pipe main body 15), two electrical wires 11 are housed in an upper facing housing space 19 of the first semi-cylindrical member 16A, and the first semi-cylindrical member 16A is covered with the second semi-cylindrical member 16B from an upper side thereof and is joined thereto. The housing space 19 of the first semi-cylindrical member 16A is open over the entire length of the shielding pipe 14 before the members are joined, and thus an operation for inserting the electrical wires 11 is not required.

In a state in which the first semi-cylindrical member 16A and the second semi-cylindrical member 16B are joined together, joining surfaces 20 of the semi-cylindrical members 16A and 16B at both ends thereof in the circumferential direction abut against each other in a surface contact state, and the two ribs 18 of the first semi-cylindrical member 16A are locked to the inner circumferential surface of the second semi-cylindrical member 16B. As a result of the ribs 18 being locked to the second semi-cylindrical member 16B, the semi-cylindrical members 16A and 16B are positioned in a state in which a relative displacement in the radial direction along the joining surfaces 20 is restricted.

A plurality of portions of the shielding pipe 14 (the pipe main body 15) that are spaced away from each other in the axial direction are regions whose axes are curved, and the regions with a curved axis are respectively defined as bending-processing portions 21, 21A, and 21B (bend). The bending-processing portions 21, 21A, and 21B are formed by performing processing for three-dimensionally bending portions of the pipe main body 15 such that the axes thereof are curved. As shown in FIGS. 5, 6, 8, and 9, linear regions of the pipe main body 15 (the shielding pipe 14) that are adjacent to the base end side (the rear end side) of the pipe main body 15 with respect to the bending-processing portions 21, 21A, and 21B are defined as base end side linear portions 22. Linear regions of the pipe main body 15 (the shielding pipe 14) that are adjacent to the leading end side (the front end side) of the pipe main body 15 with respect to the bending-processing portions 21, 21A, and 21B are defined as leading end side linear portions 23.

First Welding Portion 24 and Second Welding Portion 31

The semi-cylindrical members 16A and 16B (the pipe main body 15) that are joined together are liquid-tightly joined (fixed) to each other in a joined state through laser welding at the joining surfaces 20 thereof. Portions of the pipe main body 15 that are subjected to laser welding serve as the first welding portion 24 or the second welding portion 31. There is a concern that in bending processing, the semi-cylindrical members 16A and 16B will improperly deform or break due to stress occurring in the bending-processing portions 21, 21A, 21B, and 21C. Thus, the bending-processing portions 21, 21A, 21B, and 21C need to have high bonding strength.

However, if attempts are made to increase the bonding strength of the long semi-cylindrical members 16A and 16B over the entire length thereof, it takes a long time to weld. In view of this, regions that need to have high bonding strength are welded by the first welding portions 24 whose time required for welding is relatively long, and regions that need not have high bonding strength are joined by the second welding portions 31 whose time required for welding is relatively short. The shielding pipe 14 is continuously and liquid-tightly joined over the entire length by the plurality of first welding portions 24, and the plurality of second welding portions 31.

The first welding portions 24 and the second welding portions 31 are all joint portions formed through laser welding. In laser welding, outer circumferential surfaces of the semi-cylindrical members 16A and 16B are irradiated with laser light in a state in which the joining surfaces 20 of the semi-cylindrical members 16A and 16B are in tight contact with each other such that there is almost no gap, to melt portions of the joining surfaces 20 of the semi-cylindrical members 16A and 16B and liquid-tightly adhere the joining surfaces 20 to each other.

Figure 10:
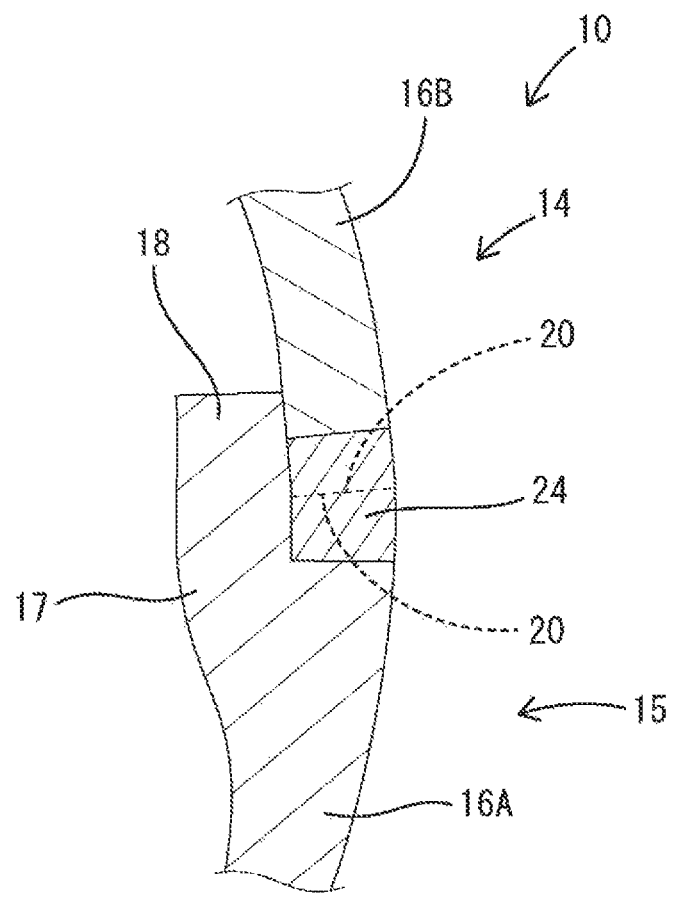
FIG. 10 is an enlarged cross-sectional view of a first welding portion.

As shown in FIG. 10, in a first welding portion 24, the semi-cylindrical members 16A and 16B are joined over all the regions of the semi-cylindrical members 16A and 16B in the radial direction (that is, the entire range extending from the outer circumferential surfaces of the semi-cylindrical members 16A and 16B to the inner circumferential surfaces thereof). That is, the first welding portion 24 is a portion where full penetration welding has been performed from the outer circumferential surface to the inner circumferential surface of the shielding pipe 14. A portion joined by the first welding portion 24 has high bonding strength because the joining area (that is, a joining range in the radial direction) of this portion is wide, although it takes time to weld. The first welding portions 24 only weld partial regions (the bending-processing portions 21, 21A, and 21B, the base end side linear portions 22, and the leading end side linear portions 23) of the semi-cylindrical members 16A and 16B that include at least the bending-processing portions 21, 21A, and 21B in the axial direction.

Figure 11:
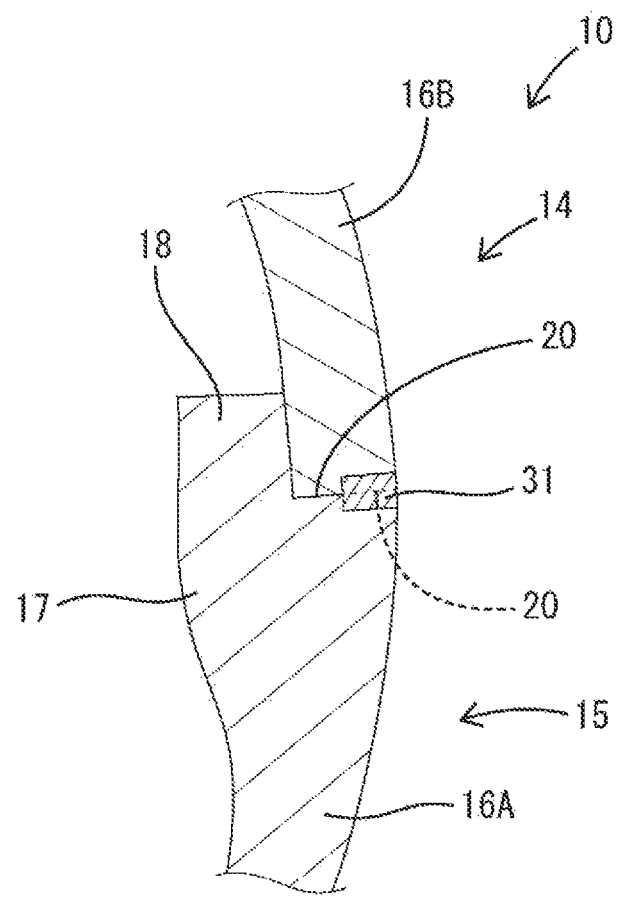
FIG. 11 is an enlarged cross-sectional view of a second welding portion.

As shown in FIG. 11, in a second welding portion 31, only partial regions of the semi-cylindrical members 16A and 16B in the radial direction (that is, a range from the outer circumferential surfaces of the semi-cylindrical members 16A and 16B to positions located on the outer circumferential side with respect to the inner circumferential surfaces thereof) are joined. That is, the second welding portion 31 is a portion where partial welding by which welding does not reach the inner circumferential surface of the shielding pipe 14 has been performed. Because the joining area (that is, a joining range in the radial direction) of a portion joined by the second welding portion 31 is narrower than that of the first welding portion 24, the time required for welding is shorter than that for the first welding portion 24, although the bonding strength of the portion joined by the second welding portion 31 is lower than a portion joined by the first welding portion 24. The second welding portion 31 joins all the regions of the semi-cylindrical members 16A and 16B that are not welded by the first welding portions 24 in the axial direction.

One first welding portion 24 is constituted by a bending portion welding region 25, a base end side welding region 26, and a leading end side welding region 27, and these three welding regions 25, 26, and 27 are continuously connected to each other in the axial direction of the pipe main body 15. The bending portion welding regions 25 weld the same regions of the semi-cylindrical members 16A and 16B as the bending-processing portions 21, 21A, and 21B in the axial direction. The base end side welding regions 26 weld the same regions of the semi-cylindrical members 16A and 16B as the base end side linear portions 22 in the axial direction. The leading end side welding regions 27 weld the same regions of the semi-cylindrical members 16A and 16B as the leading end side linear portions 23 in the axial direction. Also, the length of the base end side welding region 26 in the axial direction is set smaller than that of the leading end side welding region 27.

Process for Bending Shielding Pipe 14

Figure 4:
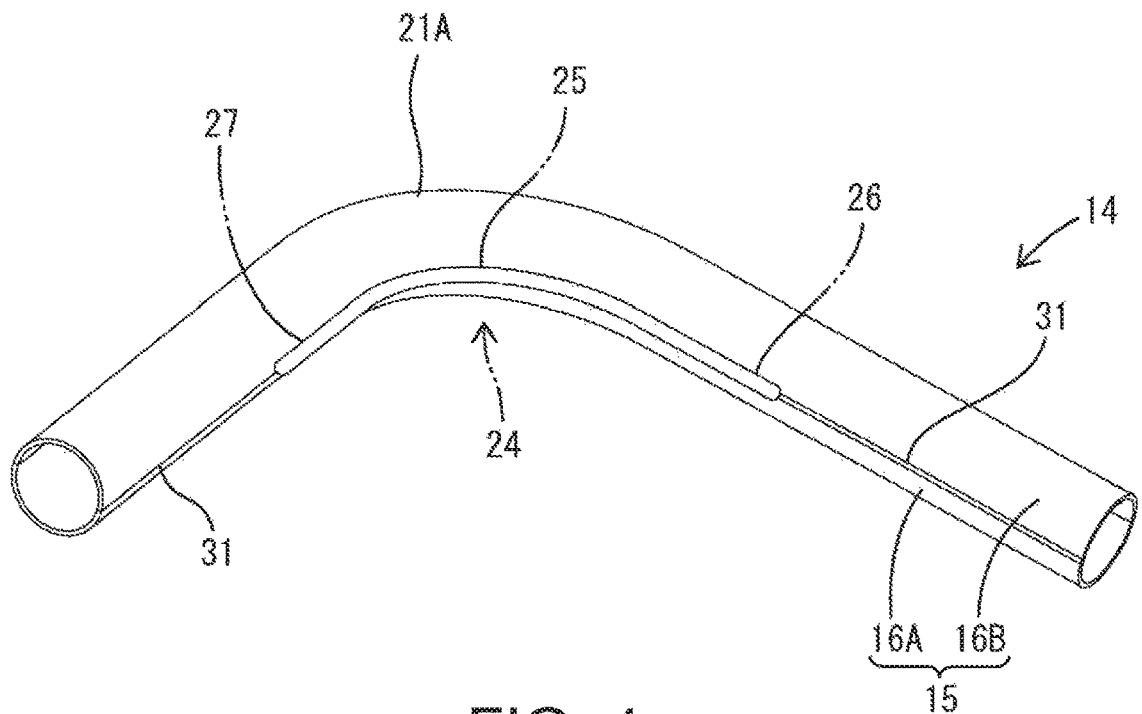
FIG. 4 is a perspective view showing one example of a bending-processing portion.
Figure 5:
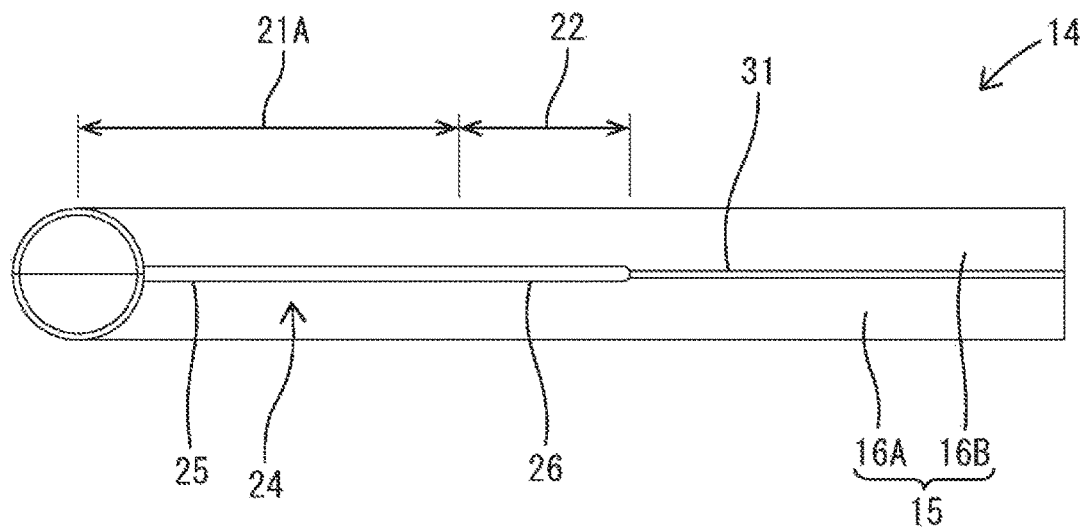
FIG. 5 is a front view of the bending-processing portion shown in FIG. 4.
Figure 6:
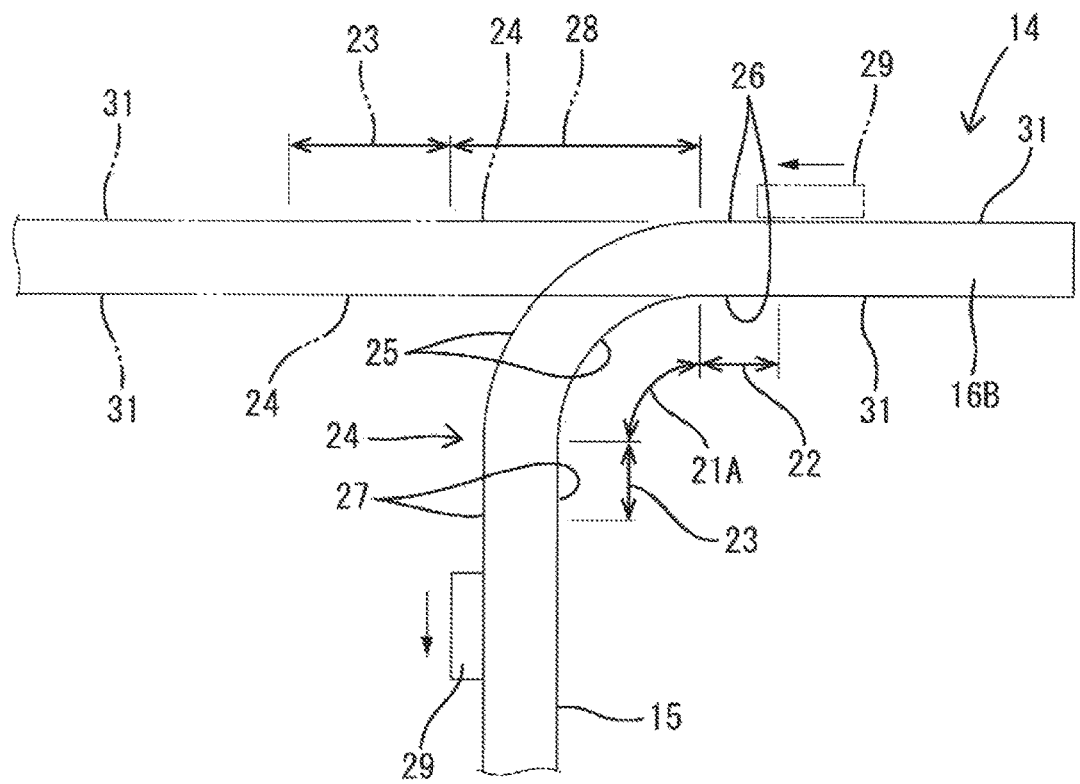
FIG. 6 is a plan view showing a process for bending the bending-processing portion shown in FIG. 4.

Next, a process for bending the shielding pipe 14 will be described. The bending-processing portion 21A shown in FIGS. 4 to 6 is formed by performing bending processing on the pipe main body 15 on a two-dimensional plane that is substantially parallel to the joining surfaces 20 of the semi-cylindrical members 16A and 16B that have not undergone bending processing. As indicated by an imaginary line in FIG. 6, in a pre-bending processing state, the base end side linear portion 22, the pre-processing linear region 28 that is to serve as the bending-processing portion 21A, and the leading end side linear portion 23 are linearly continuous with each other.

As shown in FIG. 6, when the bending-processing portion 21A is subjected to bending processing, the base end side linear portion 22 of the shielding pipe 14 located on the base end side with respect to the pre-processing linear region 28 that is to be the bending-processing portion 21A is not fixed by a clamp or the like, and a bending jig 29 is pressed against the base end portion (the rear end portion) of the base end side welding region 26 located on the outer bending side. The bending jig 29 is then slid against the first welding portion 24 (the base end side welding region 26 and the bending portion welding region 25) toward the leading end side (the front end side) of the pipe main body 15 while a pressing force is being applied in a radially inward direction of the pipe main body 15. As a result of receiving the pressing force of the bending jig 29, the pre-processing linear region 28 is subjected to bending deformation and becomes the bending-processing portion 21A.

There is a concern that improper deformation or breaks called "cracks" will occur in the pre-processing linear region 28 and the leading end side linear portion 23 in the process in which the bending jig 29 is slid against the pre-processing linear region 28 while applying a pressing force to the pipe main body 15. However, there is no risk that "cracks" will occur because the cylindrical shapes of the pre-processing linear region 28 and the leading end side linear portion 23 are respectively maintained due to the semi-cylindrical members 16A and 16B being joined by the bending portion welding region 25 and the leading end side welding region 27.

Figure 7:
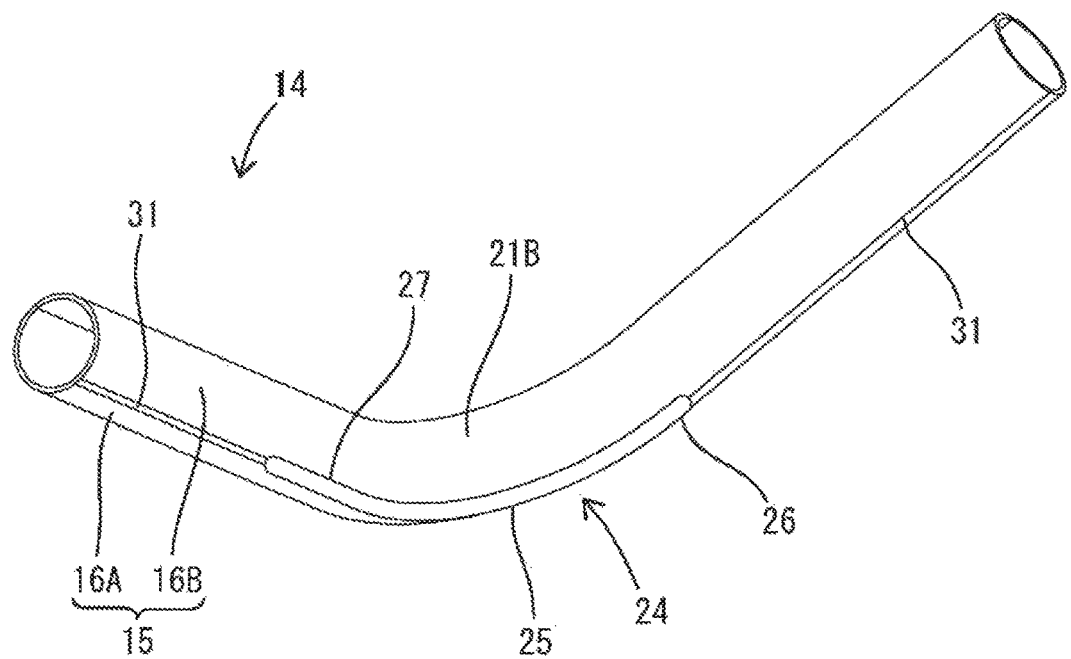
FIG. 7 is a perspective view showing another example of a bending-processing portion.
Figure 8:
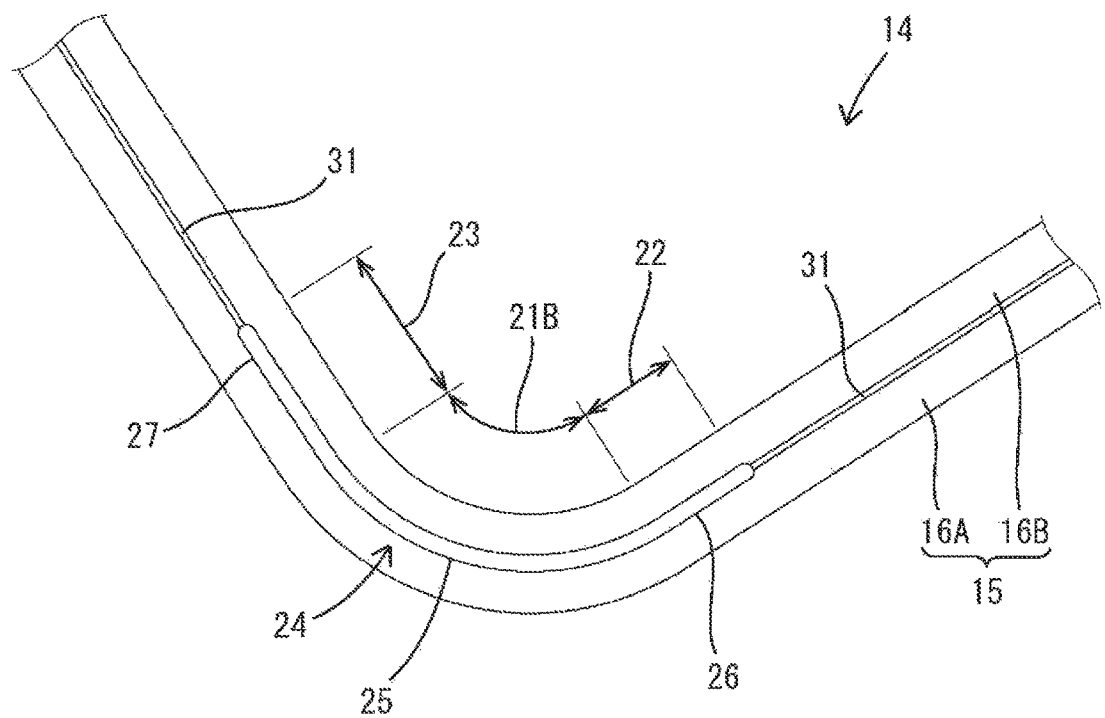
FIG. 8 is a side view of the bending-processing portion shown in FIG. 7.
Figure 9:
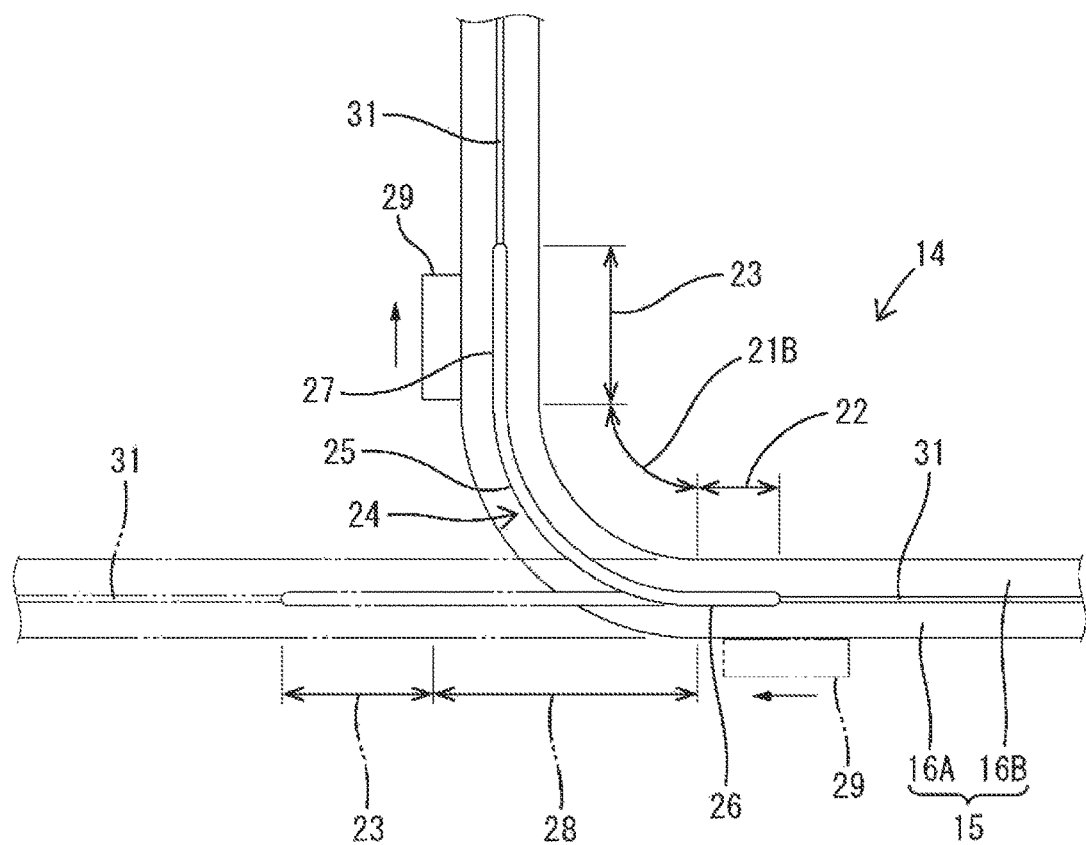
FIG. 9 is a side view showing a process for bending the bending-processing portion shown in FIG. 7.

Also, the bending-processing portion 21B shown in FIGS. 7 to 9 is formed by performing bending processing on the pipe main body 15 on a two-dimensional plane that is orthogonal to the joining surfaces 20 of the semi-cylindrical members 16A and 16B that have not undergone bending processing and that is parallel to the axis of the pipe main body 15 that has not undergone bending processing. As indicated by an imaginary line in FIG. 9, in a pre-bending processing state, the base end side linear portion 22, the pre-processing linear region 28 that is to serve as the bending-processing portion 21B, and the leading end side linear portion 23 are linearly continuous with each other.

As shown in FIG. 9, when the bending-processing portion 21B is subjected to bending processing, the base end side linear portion 22 located on the base end side with respect to the pre-processing linear region 28 is not fixed by a clamp or the like, and the bending jig 29 is pressed against the outer circumferential surface of the base end side linear portion 22. The position against which the bending jig 29 is pressed is a position at which the angle of the bending jig 29 to the base end side welding region 26 is 90 degrees in the circumferential direction of the pipe main body 15, and is a position corresponding to the rear end portion (the base end portion) of the base end side welding region 26 in the axial direction of the pipe main body 15. The bending jig 29 is slid against the base end side linear portion 22 and the pre-processing linear region 28 toward the leading end side (the front end side) of the pipe main body 15 while a pressing force is being applied in a radially inward direction of the pipe main body 15. As a result of receiving the pressing force of the bending jig 29, the pre-processing linear region 28 is subjected to bending deformation and becomes the bending-processing portion 21B.

There is a concern that the semi-cylindrical members 16A and 16B will open in the radial direction (the up-down direction in FIG. 9) in the base end side linear portion 22 and the joining surfaces 20 will separate from each other in the process in which the bending jig 29 is slid against the pre-processing linear region 28 while applying a pressing force to the pipe main body 15. However, there is no risk that the joining surfaces 20 will separate from each other because the semi-cylindrical members 16A and 16B are kept joined (a joined state) by the base end side welding region 26 in the base end side linear portion 22.

Similarly, there is a concern that improper deformation or breaks called "cracks" will occur in the pre-processing linear region 28 and the leading end side linear portion 23 of the semi-cylindrical members 16A and 16B in the process in which the bending jig 29 is slid against the pre-processing linear region 28 while applying a pressing force to the pipe main body 15. However, there is no risk that "cracks" will occur because the cylindrical shapes of the pre-processing linear region 28 and the leading end side linear portion 23 are respectively maintained due to the semi-cylindrical members 16A and 16B being joined by the bending portion welding region 25 and the leading end side welding region 27.

Effects of Embodiment 1

The shielded conductive path 10 of Embodiment 1 is provided with the shielding pipe 14, the electrical wires 11, the first welding portions 24, and the second welding portions 31. The shielding pipe 14 is in a state in which the two semi-cylindrical members 16A and 16B made of a metal material are joined together, and the cylindrical and long pipe main body 15 is constituted as a result of the two semi-cylindrical members 16A and 16B being joined together. Portions (a plurality of portions that are spaced away from each other in the axial direction) of the shielding pipe 14 (the pipe main body 15) in the axial direction are provided with a plurality of bending-processing portions 21, 21A, and 21B.

A plurality of electrical wires 11 are housed in the shielding pipe 14 in a state in which the electrical wires 11 are substantially coaxially inserted into the shielding pipe 14. The first welding portions 24 are provided only in partial regions (a plurality of portions) of the shielding pipe 14 that include at least the bending-processing portions 21, 21A, and 21B in the axial direction. The second welding portions 31 are provided in all regions of the shielding pipe 14 other than the first welding portions 24 in the axial direction. The two semi-cylindrical members 16A and 16B are joined by the first welding portions 24 and the second welding portions 31 in a liquid-tightly and mechanically integrated state and are kept joined.

According to the shielded conductive path 10 of Embodiment 1, because the two semi-cylindrical members 16A and 16B are liquid-tightly joined by the first welding portions 24 and the second welding portions 31 over the entire length thereof, water is prevented from entering the shielding pipe 14 from the joined portions of the two semi-cylindrical members 16A and 16B. Also, because the joining range of the second welding portion 31 in the radial direction is narrower than that of the first welding portion 24, the time required for welding can be reduced. Thus, it is possible to reduce the time needed for manufacturing the shielded conductive path 10 configured with the electrical wires 11 housed in the pipe main body 15.

Also, the joining range of the first welding portion in the radial direction and the joining range of the second welding portion 31 in the radial direction includes the outer circumferential surfaces of the semi-cylindrical members 16A and 16B. Thus, in the first welding portions 24 and the second welding portions 31, no gap having a groove shape appears at the seam on outer peripheries of the two semi-cylindrical members 16A and 16B. Thus, there is no risk that water will remain in the outer peripheries of the two semi-cylindrical members 16A and 16B (the shielding pipe 14). Also, the joining range of the first welding portion 24 in the radial direction is the entire region extending from the outer peripheries to the inner peripheries of the semi-cylindrical members 16A and 16B, and thus the maximum bonding strength in the first welding portion 24 is ensured.

Also, in the bending process, the bending jig 29 is slid against the outer periphery of the pre-processing linear region 28, which will become the bending-processing portions 21, 21A, and 21B through bending processing, in a pressed state from the base end side toward the leading end side. Thus, if the pre-processing linear region 28 is joined by the second welding portion 31, there is a concern that, on the leading end side with respect to the bending-processing portions 21, 21A, and 21B, the second welding portion 31 will break, the two semi-cylindrical members 16A and 16B will positionally shift relative to each other in the axial direction, and cracks will occur in the semi-cylindrical members 16A and 16B.

In view of this point, in Embodiment 1, the leading end side linear portion 23 that is continuous with the leading end side of the pre-processing linear region 28 is joined by the first welding portion 24 having higher bonding strength than that of the second welding portion 31. Accordingly, it is possible to prevent the two semi-cylindrical members 16A and 16B from positionally shifting relative to each other in the axial direction and to prevent cracks from occurring in the semi-cylindrical members 16A and 16B, on the leading end side with respect to the bending-processing portions 21, 21A, and 21B.

Also, the process for forming the bending-processing portions 21, 21A, and 21B is performed in a state in which the base end side with respect to the pre-processing linear region 28 (the base end side linear portion 22) is not fixed. Thus, if the base end side linear portion 22 is joined by the second welding portion 31, there is a concern that the second welding portion 31 will break and the two semi-cylindrical members 16A and 16B will separate from each other in the radial direction on the base end side with respect to the bending-processing portions 21, 21A, and 21B (the base end side linear portion 22) in the process in which the bending jig 29 is slid against the pre-processing linear region 28 from the base end side to the leading end side. However, because the base end side linear portion 22 is joined by the first welding portion 24 having higher bonding strength than that of the second welding portion 31, it is possible to prevent the two semi-cylindrical members 16A and 16B from separating from each other in the radial direction on the base end side with respect to the bending-processing portions 21, 21A, and 21B.

Also, the first welding portions 24 each include the bending portion welding region 25 where the bending-processing portions 21, 21A, and 21B are joined, the leading end side welding region 27 where the leading end side linear portion 23 is joined, and the base end side welding region 26 where the base end side linear portion 22 is joined, and the length of the leading end side welding region 27 is set larger than that of the base end side welding region 26. The technical significance of this configuration will be described below.

While the bending jig 29 that slides against the pre-processing linear region 28, which is to be the bending-processing portion 21, 21A, or 21B, in a pressed state moves from the base end to the leading end of the pre-processing linear region 28, a force that makes the two semi-cylindrical members 16A and 16B displace relative to each other in the axial direction, and a force that forms cracks in the semi-cylindrical members 16A and 16B are constantly applied to the leading end side welding region 27. Thus, providing the leading end side welding region 27 long in the axial direction makes it possible to effectively prevent cracking and relative displacement of the semi-cylindrical members 16A and 16B in the axial direction.

Similarly, in the process for forming the bending-processing portions 21, 21A, and 21B, a force applied from the bending jig 29 that is slid against the pre-processing linear region 28 in a pressed state to the base end side welding region 26 decreases as the bending jig 29 moves away from the base end (the base end side welding region 26) of the pre-processing linear region 28. Thus, even if the length of the base end side welding region 26 in the axial direction is reduced, it is possible to effectively prevent separation of the two semi-cylindrical members 16A and 16B in the radial direction. The above-described configuration makes it possible to keep the length of the base end side welding region 26 to the shortest necessary length, and thus to more effectively reduce the time needed for manufacturing the shielded conductive path 10.

Other Embodiments

The present disclosure is not limited to the embodiment described above with use of the foregoing description and drawings, and embodiments such as the following are also encompassed in the technical scope of the present disclosure.

(1) Although the joining range of the first welding portion in the radial direction includes the outer circumferential surfaces of the semi-cylindrical members in the above-described embodiment, the joining range of the first welding portion in the radial direction may be regions of the semi-cylindrical members located on an inner circumferential side with respect to the outer circumferential surfaces thereof.

(2) Although the joining range of the first welding portion in the radial direction is the entire region extending from the outer peripheries of the semi-cylindrical members to the inner peripheries thereof in the above-described embodiment, the joining range of the first welding portion in the radial direction may only be portions of the semi-cylindrical members between the outer peripheries and the inner peripheries thereof.

(3) Although the joining range of the second welding portion in the radial direction includes the outer circumferential surfaces of the semi-cylindrical members in the above-described embodiment, the joining range of the second welding portion in the radial direction may be regions of the semi-cylindrical members located on an inner circumferential side with respect to the outer circumferential surface thereof.

(4) Although the joining range of the first welding portion in the radial direction is constant over the entire length of the first welding portion in the above-described embodiment, a configuration may be adopted in which the joining range of the first welding portion in the radial direction gradually increases or decreases along the length direction of the first welding portion, or increases and decreases in the length direction of the first welding portion.

(5) Although the joining range of the second welding portion in the radial direction is constant over the entire length of the second welding portion in the above-described embodiment, a configuration may be adopted in which the joining range of the second welding portion in the radial direction gradually increases or decreases along the length direction of the second welding portion, or increases and decreases in the length direction of the second welding portion.

(6) Although the leading end side linear portion located on the leading end side with respect to the bending-processing portion is joined by the first welding portion in the above-described embodiment, the leading end side linear portion may be joined by the second welding portion.

(7) Although the base end side linear portions located on the base end side with respect to the bending-processing portions are joined by the first welding portion in the above-described embodiment, the base end side linear portion may be joined by the second welding portion.

(8) Although the bending portion welding region provided in the bending-processing portion of the shielding pipe (the pipe main body) and the leading end side welding region provided on the leading end side with respect to the bending-processing portion are directly connected to each other in the above-described embodiment, the bending portion welding region and the leading end side welding region may be provided separately from each other (in a positional relationship in which the bending portion welding region and the leading end side welding region are separated from each other in the axial direction).

(9) Although the bending portion welding region provided in the bending-processing portion of the shielding pipe (the pipe main body) and the base end side welding region provided on the base end side with respect to the bending-processing portion are directly connected to each other in the above-described embodiment, the bending portion welding region and the base end side welding region may be provided separately from each other (in a positional relationship in which the bending portion welding region and the base end side welding region are separated from each other in the axial direction).

(10) Although the length of the leading end side welding region is set larger than that of the base end side welding region in the above-described embodiment, the length of the leading end side welding region may be the same as the length of the base end side welding region, or may be smaller than that of the base end side welding region.

(11) Although the conductors of the electrical wires are constituted only by twisted wires over the entire length thereof in the above-described embodiment, a configuration may be adopted in which a conductor of a portion of an electrical wire that is inserted into the shielding pipe is constituted by a single core wire, and a conductor of a portion of the electrical wire that is routed outside the shielding pipe is constituted by a twisted wire.

The invention claimed is:

1. A shielded conductive path, comprising:
   a cylindrical shielding pipe that is in a state in which two semi-cylindrical members made of a metal material are joined together, and that is provided with a bend at a portion located in an axial direction;
   an electrical wire housed in the shielding pipe;
   a first weld that is provided only in a partial region of the shielding pipe that includes at least the bend in the axial direction, the first weld liquid-tightly joining the two semi-cylindrical members; and
   a second weld that is provided in all regions of the shielding pipe other than the first weld in the axial direction, the second weld liquid-tightly joining the two semi-cylindrical members,
   wherein a joining range of the second weld in a radial direction is narrower than a joining range of the first weld in the radial direction.

2. The shielded conductive path according to claim 1, wherein the joining range of at least one of the first weld and the second weld in the radial direction includes outer circumferential surfaces of the semi-cylindrical members.

3. The shielded conductive path according to claim 1, wherein a leading end side linear portion of the shielding pipe that is adjacent to a leading end side of the bend in the axial direction is joined by the first weld.

4. The shielded conductive path according to claim 1, wherein a base end side linear portion of the shielding pipe that is adjacent to a base end side of the bend in the axial direction is joined by the first weld.

5. The shielded conductive path according to claim 4, wherein the first weld includes a bending portion welding region where the bend is joined, a leading end side welding region where the leading end side linear portion is joined, and a base end side welding region where the base end side linear portion is joined, and
the length of the leading end side welding region is set larger than that of the base end side welding region.

6. A shielding pipe, comprising:
   two semi-cylindrical members made of a metal material;
   a cylindrical pipe main body that is in a state in which the two semi-cylindrical members are joined together, whose inner portion serves as an electrical wire housing space for housing an electrical wire, and that is provided with a bend at a portion located in an axial direction, a first weld that is provided only in a partial region of the pipe main body that includes at least the bend in the axial direction, the first weld liquid-tightly joining the two semi-cylindrical members; and a second weld that is provided in all regions of the pipe main body other than the first weld in the axial direction, the second weld liquid-tightly joining the two semi-cylindrical members, wherein a joining range of the second weld in a radial direction is narrower than a joining range of the first weld in the radial direction.

* * * * *